(12) United States Patent
Wei et al.

(10) Patent No.: US 11,257,773 B1
(45) Date of Patent: Feb. 22, 2022

(54) PACKAGED CIRCUIT STRUCTURE AND METHOD FOR MANUFACTURING THE SAME

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Yong-Chao Wei, Qinhuangdao (CN); Lin-Jie Gao, Shenzhen (CN); Wei-Liang Wu, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 54 days.

(21) Appl. No.: 17/000,660

(22) Filed: Aug. 24, 2020

(30) Foreign Application Priority Data

Jul. 30, 2020 (CN) .......................... 202010754207.3

(51) Int. Cl.
*H01L 23/66* (2006.01)
*H01L 23/552* (2006.01)
(Continued)

(52) U.S. Cl.
CPC .......... *H01L 23/66* (2013.01); *H01L 21/4853* (2013.01); *H01L 21/4882* (2013.01);
(Continued)

(58) Field of Classification Search
CPC . H01L 23/66; H01L 23/367; H01L 23/49811; H01L 23/49833; H01L 23/552; H01L 21/4853; H01L 21/4882; H01L 2223/6611; H01L 2223/6677; H01Q 1/2283
USPC .......... 257/728, 784, 77, 664, 690, E23.114, 257/E23.064, E23.01, E23.178, E21.502, 257/E21.503, E21.506, E25.029, E25.031; 438/700, 667, 107
See application file for complete search history.

(56) References Cited

U.S. PATENT DOCUMENTS

| | | | |
|---|---|---|---|
| 10,349,518 B1 * | 7/2019 | Huang | H05K 1/05 |
| 2006/0148166 A1 * | 7/2006 | Craig | H01L 25/50 |
| | | | 438/222 |

(Continued)

*Primary Examiner* — Dao H Nguyen
(74) *Attorney, Agent, or Firm* — ScienBiziP, P.C.

(57) ABSTRACT

A package circuit structure includes a metal board including a first surface and a second surface, a plurality of embedded components, an insulating layer, and two antenna circuit boards. At least one first groove is recessed from the first surface. At least one second groove is recessed from the second surface. The first groove and the second groove are spaced with each other along a first direction perpendicular to a thickness direction of the metal board. Each embedded component is mounted in the first groove or the second groove. The insulating layer covers the first surface and the second surface and fills the first groove and the second groove. The antenna circuit boards are respectively stacked on two opposite sides of the insulating layer. Each antenna circuit board includes at least one antenna and at least one ground wiring. The metal board is electrically connected to each ground wiring.

18 Claims, 10 Drawing Sheets

(51) Int. Cl.
*H01L 23/367* (2006.01)
*H01L 23/498* (2006.01)
*H01L 21/48* (2006.01)
*H01Q 1/22* (2006.01)

(52) U.S. Cl.
CPC ...... *H01L 23/367* (2013.01); *H01L 23/49811* (2013.01); *H01L 23/49833* (2013.01); *H01L 23/552* (2013.01); *H01Q 1/2283* (2013.01); *H01L 2223/6611* (2013.01); *H01L 2223/6677* (2013.01)

(56) References Cited

U.S. PATENT DOCUMENTS

| | | | |
|---|---|---|---|
| 2020/0373262 A1* | 11/2020 | Chen | H01L 23/481 |
| 2021/0257739 A1* | 8/2021 | Mathews | H01Q 3/30 |
| 2021/0305710 A1* | 9/2021 | Chang | H05K 3/4697 |

* cited by examiner

PACKAGED CIRCUIT STRUCTURE AND METHOD FOR MANUFACTURING THE SAME

FIELD

The subject matter herein generally relates to a package circuit structure and a method for manufacturing the package circuit structure, particularly relates to a package circuit structure with at least one antenna module and a method for manufacturing the package circuit structure with at least one antenna module.

BACKGROUND

With the development of the 5th generation wireless systems, more components need to be integrated into the antenna module. An electromagnetic interference between components and heat produced by the antenna module have increased.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
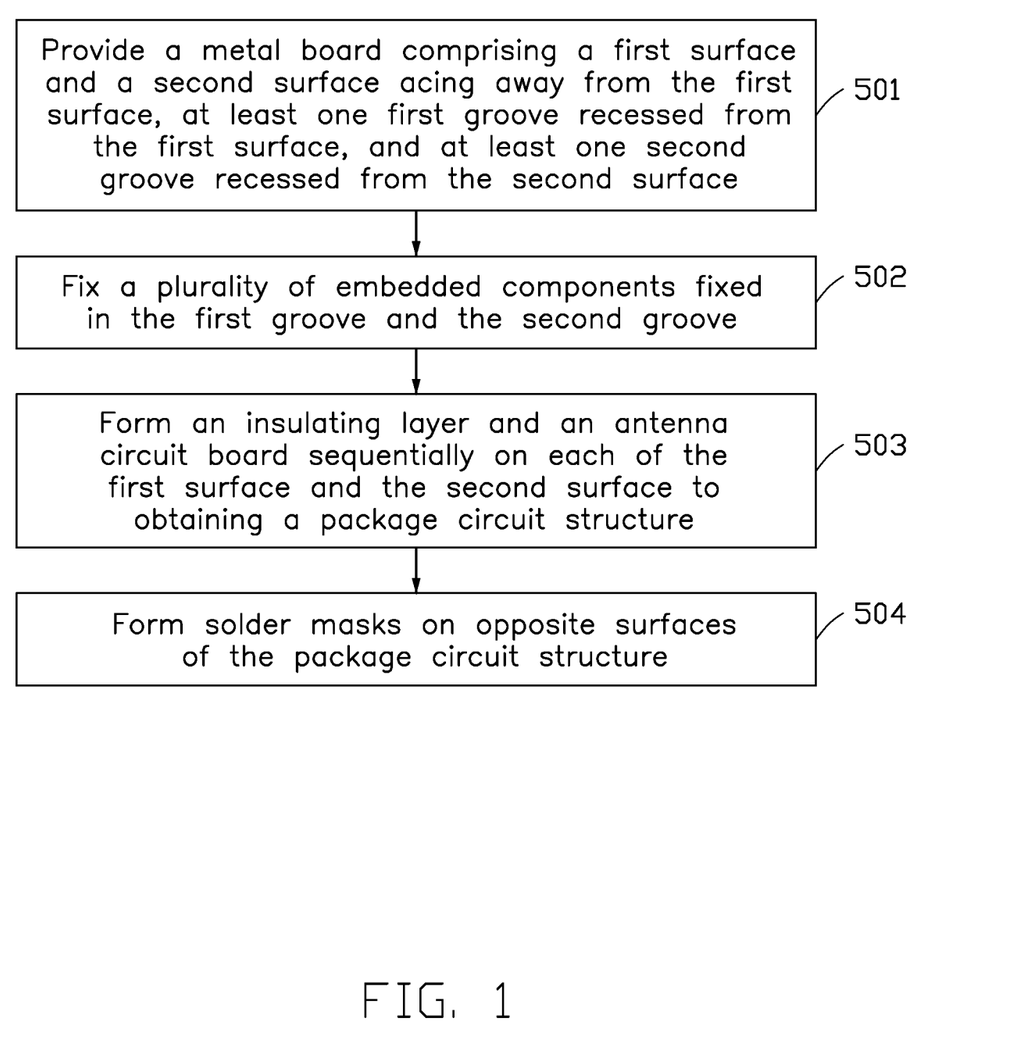
FIG. 1 is a flowchart of an embodiment of a method for manufacturing a package circuit structure.

FIG. 1 illustrates a flowchart of a method in accordance with an embodiment. The method for manufacturing a package circuit structure is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 501.

Figure 2:
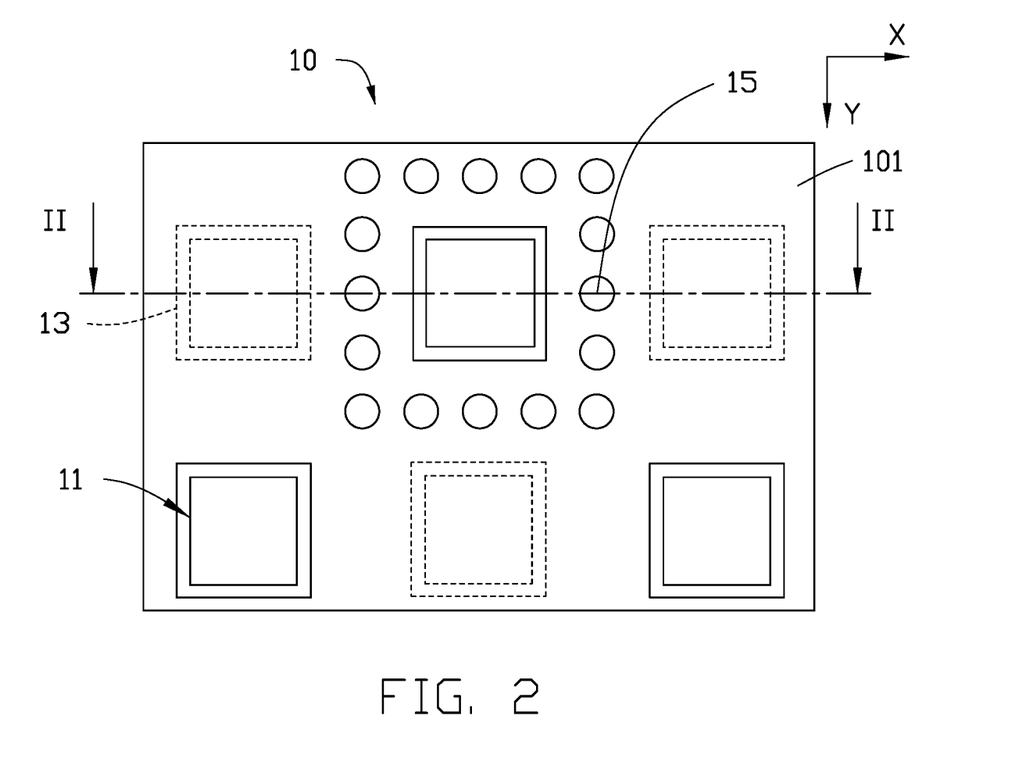
FIG. 2 is a diagrammatic view of an embodiment of a metal board.

At block 501, referring to FIG. 2, a metal board 10 is provided. At least one through hole 15, at least one first groove 11, and at least one second groove 13 are defined on the metal board 10.

Figure 3:
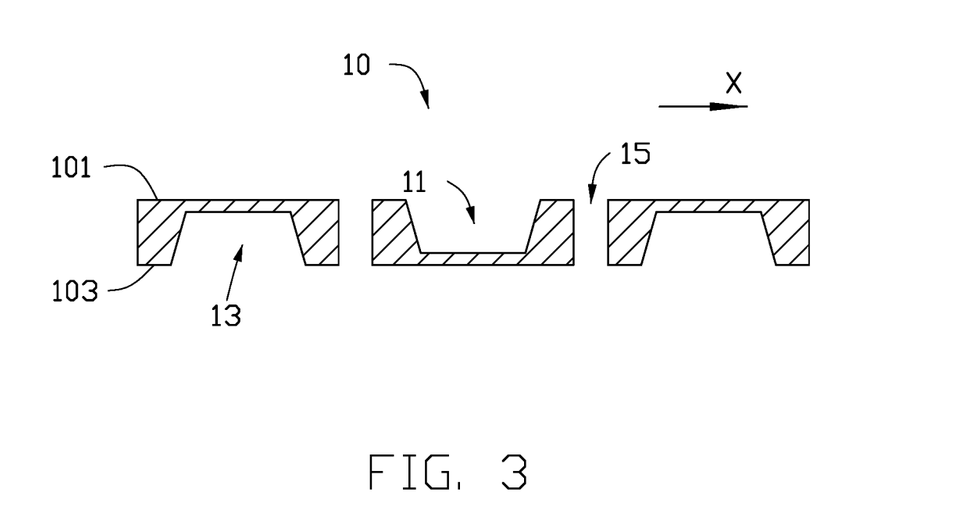
FIG. 3 is a cross-sectional view of the metal board of FIG. 2.

Referring to FIG. 3, the metal board 10 includes a first surface 101 and a second surface 103 facing away from the first surface 101. The first surface 101 and the second surface 103 are arranged along a thickness direction of the metal board 10. Each first groove 11 is recessed from the first surface 101 toward the second surface 103. Each second groove 13 is recessed from the second surface 103 toward the first surface 101. Each first groove 11 and each second groove 13 are spaced with each other along a first direction X perpendicular to the thickness direction. Each through hole 15 penetrates the first surface 101 and the second surface 103 and is spaced from the first surface 101 and the second surface 103.

In at least one embodiment, when at least one of the number of the first grooves 11 and the number of the second grooves 13 is more than one, the first groove and the second groove 13 are alternately arranged along the first direction X.

In at least one embodiment, referring to FIG. 2, when each of the number the of the first grooves 11 and the number of the second grooves 13 is more than one, the first groove 11 and the second groove 13 may further be alternatively arranged along a second direction Y perpendicular to the first direction X and the thickness direction. So that the first grooves 11 and the second grooves 13 are arranged in a matrix.

Each first groove 11, each second groove 13, and each through hole 15 may be formed by one of chemical etching, mechanical drilling, laser cutting, and any combination of the above methods.

In at least one embodiment, a width of each first groove 11 may gradually decrease from the first surface 101 toward the second surface 103, and a width of each second groove 13 may gradually decrease from the second surface 103 toward the first surface 101.

In at least one embodiment, when the metal board 10 includes a plurality of the first grooves 11, shapes of any two first grooves 11 may be the same or different. When the metal board 10 includes a plurality of the second grooves 13, shapes of any two second grooves 13 may be the same or different. In at least one embodiment, shapes of any one of the first grooves 11 and any one of the second grooves may be the same or different.

In at least one embodiment, the metal board 10 includes a plurality of the through holes 15, and the plurality of the through holes 15 are distributed around the first groove 11 or the second groove 13.

The metal board 10 may be made of metal materials such as copper, aluminum, or an alloy formed by combining the foregoing metal materials.

Figure 4:
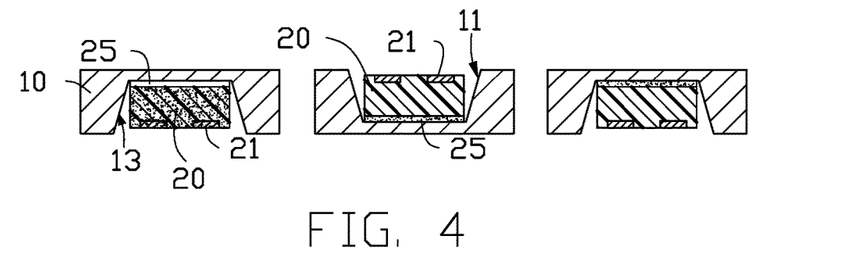
FIG. 4 is a cross-sectional view showing a plurality of embedded components received in the metal board of FIG. 3.

At block 502, referring to FIG. 4, a plurality of embedded components 20 is provided. Each embedded component 20 is fixed in the first groove 11 or the second groove 13.

In at least one embodiment, each embedded component 20 is fixed to a bottom of the first groove 11 or a bottom of the second groove 13 by an insulating glue layer 25. In at least one embodiment, each embedded component 20 may be fixed to a bottom of the first groove 11 or a bottom of the second groove 13 in other ways.

In at least one embodiment, the insulating glue layer 25 may be an adhesive material with good thermal conductivity to accelerate a heat diffusion of the embedded component 20, thereby facilitating heat dissipation.

In at least one embodiment, each embedded component 20 does not protrude from the first groove 11 or the second groove 13 receiving the embedded component 20. In at least one embodiment, a height of each embedded component 20 is less than a depth of the first groove 11 or the second groove 13 receiving the embedded component 20.

At least one conductive terminal 21 is formed on each embedded component 20. In at least one embodiment, the at least one conductive terminal 21 is formed on a surface of each embedded component 20 facing away from the bottom of the first groove 11 receiving the embedded component 20 or the bottom of the second groove 13 receiving the embedded component 20.

Figure 5:
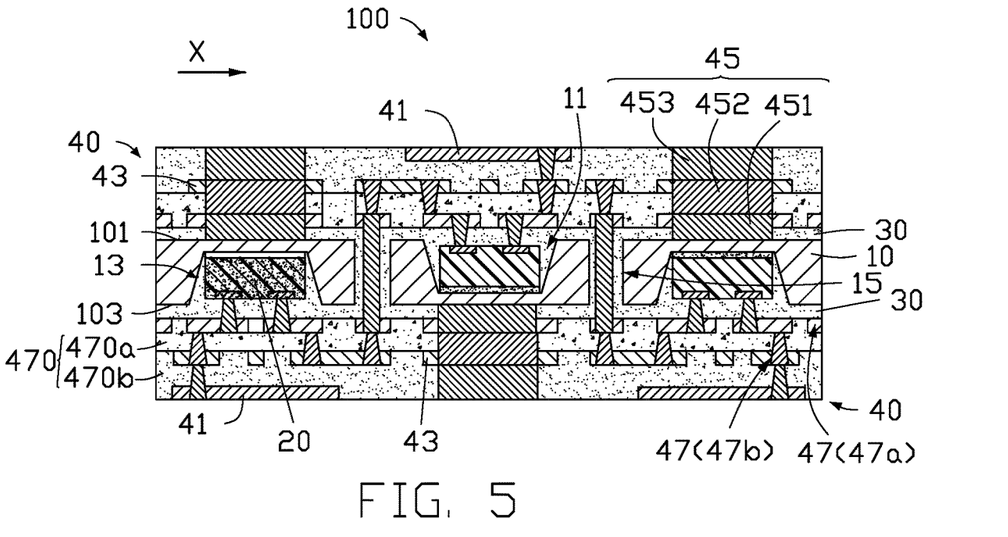
FIG. 5 is a cross-sectional view showing insulating layers and antenna circuit boards laminated on opposite sides of the metal board of FIG. 3 to obtain a package circuit structure.
Figure 6:
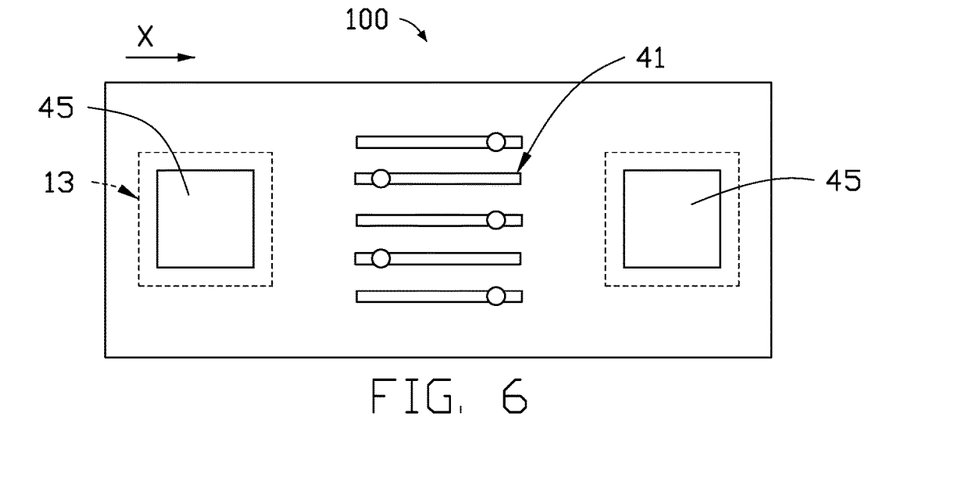
FIG. 6 is a diagrammatic view of an embodiment of a package circuit structure.
Figure 7:
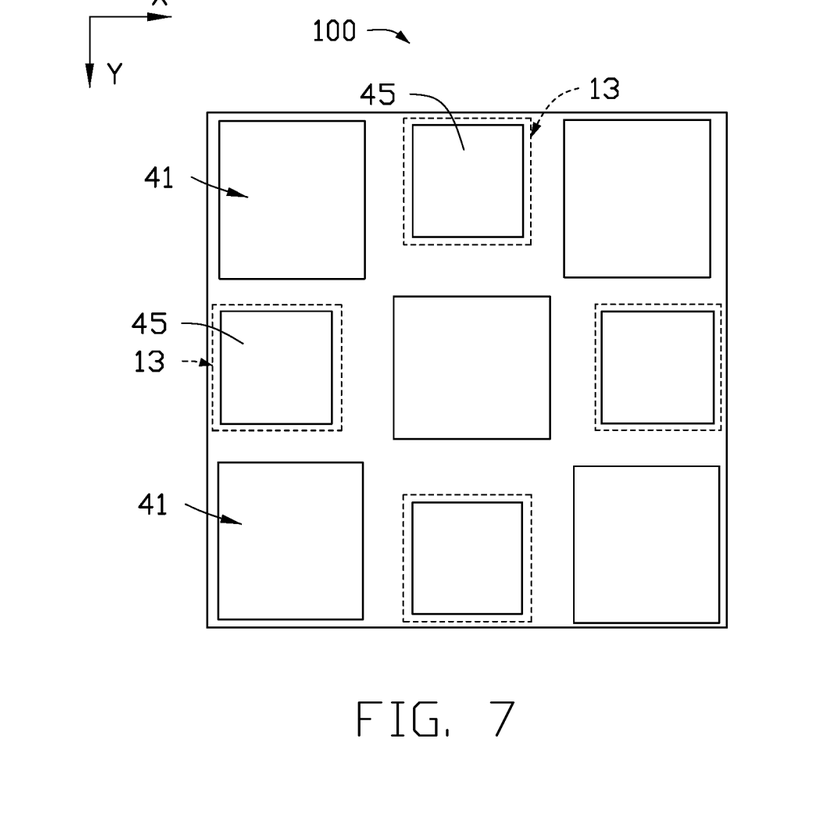
FIG. 7 is a diagrammatic view of an embodiment of a package circuit structure.

At block 503, referring to FIGS. 5, 6, and 7, an insulating layer 30 and an antenna circuit board 40 are sequentially laminated on each of the first surface 101 and the second surface 103 of the metal board 10 with the embedded components 20 respectively, thereby obtaining a package circuit structure 100. In the package circuit structure 100, the insulating layers 30 cover the first surface 101 and the second surface 103, and fill the first groove 11, the second groove 13 and the through hole 15. The antenna circuit boards 40 are stacked on opposite sides of the insulating layers 30 along the thickness direction. Each antenna circuit board 40 includes at least one antenna 41 and at least one ground wiring 43. Each antenna 41 is arranged corresponding to an opening portion of the first groove 11 or an opening portion of the second groove 13. Each ground wiring 43 is electrically connected to the metal board 10, so that electromagnetic shielding is achieved through the metal board 10 to avoid electromagnetic interference between the embedded components 20.

In at least one embodiment, a plurality of conductive heat sinks 45 is formed on the antenna circuit boards 40. Each conductive heat sink 45 penetrates one of the antenna circuit boards 40 along the thickness direction and penetrates the adjacent insulating layer 30. Each conductive heat sink 45 connects an area of the adjacent second surface 103 of the metal board 10 corresponding to the first groove 11, or connects an area of the adjacent first surface 101 of the metal board 10 corresponding to the second groove 13, thereby accelerating the heat diffusion of the embedded components 20, which is beneficial to heat dissipation. On both sides of the metal board 10 in the package circuit structure 100, an antenna area corresponding to one antenna 41 and a heat dissipation area corresponding to one conductive heat sink 45 are alternately arranged along the first direction X.

In at least one embodiment, the antenna area corresponding to one antenna 41 and the heat dissipation area corresponding to one conductive heat sink 45 may further be alternately arranged along the second direction Y. So that the antenna areas and the heat dissipation areas are arranged in a matrix.

In at least one embodiment, the metal board 10 and the ground wiring 43 are electrically connected through the conductive heat sink 45.

In at least one embodiment, each antenna circuit board 40 may further include dielectric layer 470 and at least one wiring layer 47. The at least one wiring layer 47 is sandwiched between the antenna 41 of the antenna circuit board 40 and the insulating layer 30.

The conductive terminal 21 and the antenna 41 are electrically connected through the at least one wiring layer 47. In at least one embodiment, each antenna circuit board 40 may include a first wiring layer 47a and a second wiring layer 47b. the second wiring layer 47b includes the ground wiring 43. In at least one embodiment, the each antenna circuit board 40 may further include other wiring layers.

In at least one embodiment, the antenna circuit board 40 may further include at least one inner antenna (not shown).

Figure 8:
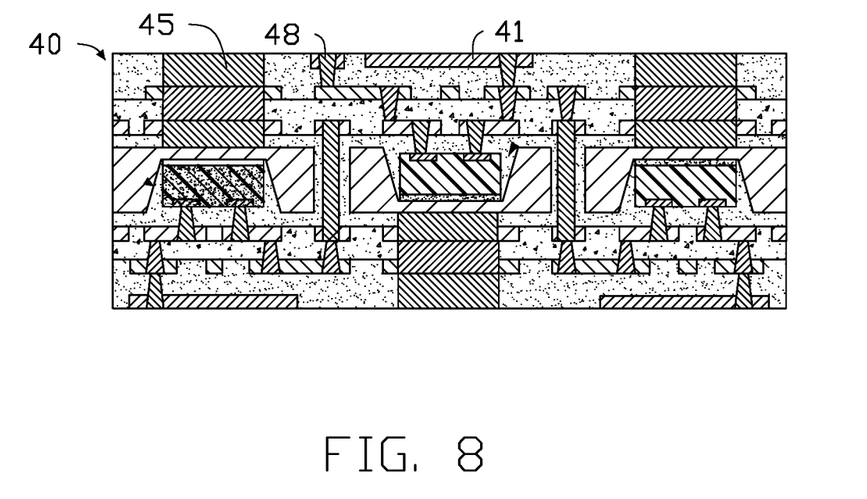
FIG. 8 is a cross-sectional view of an embodiment of a package circuit structure.
Figure 9:
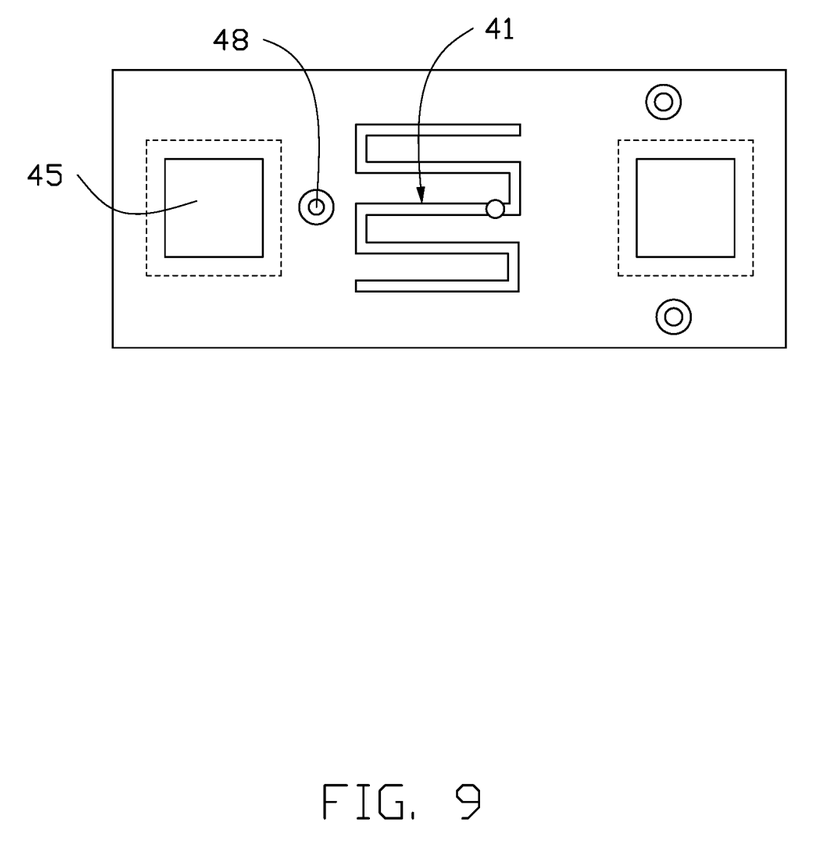
FIG. 9 is a diagrammatic view of an embodiment of the package circuit structure of FIG. 8.

In at least one embodiment, referring to FIGS. 8 and 9, each antenna circuit board 40 may further include at least one connecting pad 48 exposed from a side of the corresponding antenna circuit board 40 facing away from the metal board 10 for connecting other electronic elements. Each connecting pad 48 electrically connects the wiring layer 47.

In at least one embodiment, the method may further include the block 504.

At block 504, solder masks (not shown) are formed on opposite surfaces of the package circuit structure 100.

When the antenna circuit board 40 includes the connecting pad 48, the connecting pad 48 is exposed from the solder masks for connecting other electronic elements.

Figure 10:
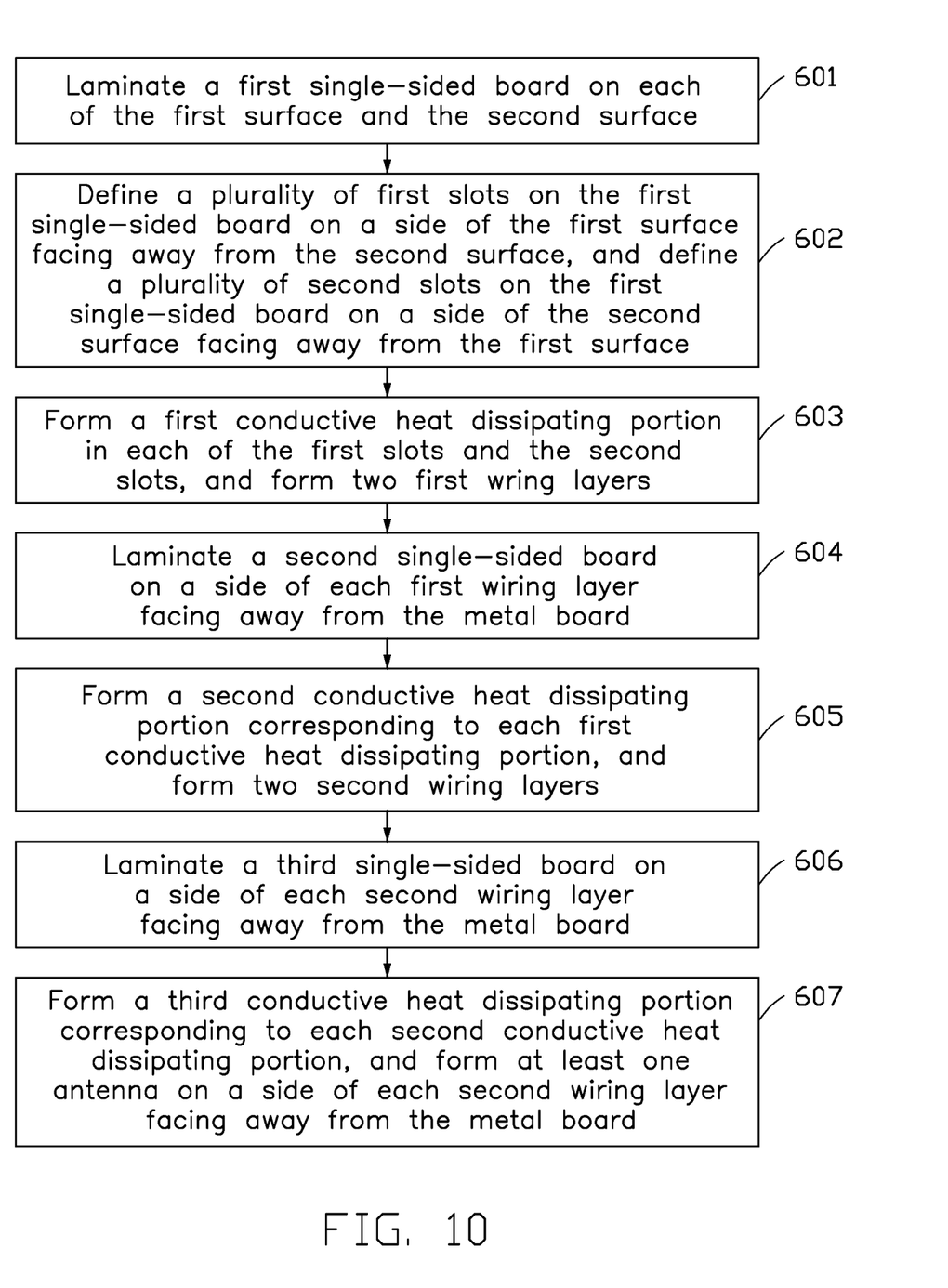
FIG. 10 is a flowchart of an embodiment of a method for laminating the insulating layers and the antenna circuit boards on the metal board.

FIG. 10 illustrates a flowchart of an embodiment of a method for manufacturing the package circuit structure 100 by sequentially laminating the insulating layer 30 and the antenna circuit board 40 on each of the first surface 101 and the second surface 103 of the metal board 10 with the embedded components 20 respectively. The method can begin at block 601.

Figure 11:
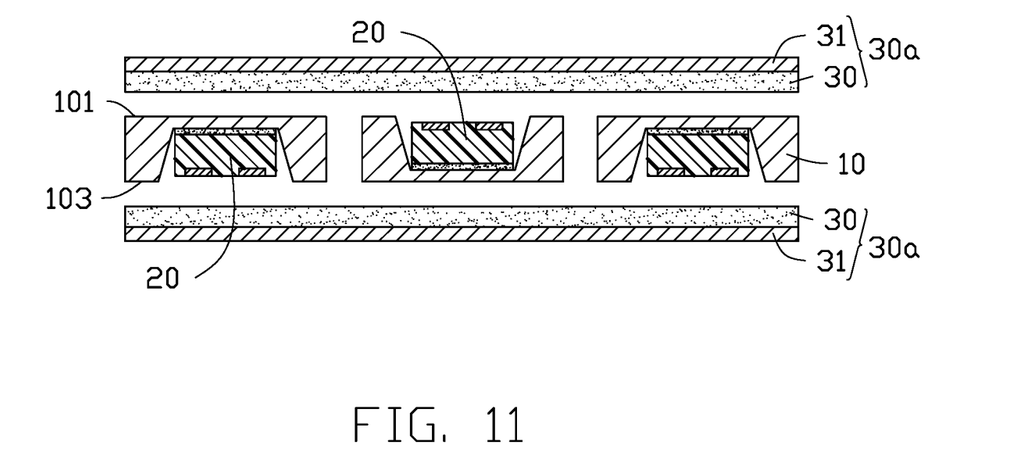
FIGS. 11-17 is are cross-sectional views of illustrating respective steps of an embodiment of a method for laminating the insulating layers and the antenna circuit boards on the metal board.
Figure 12:
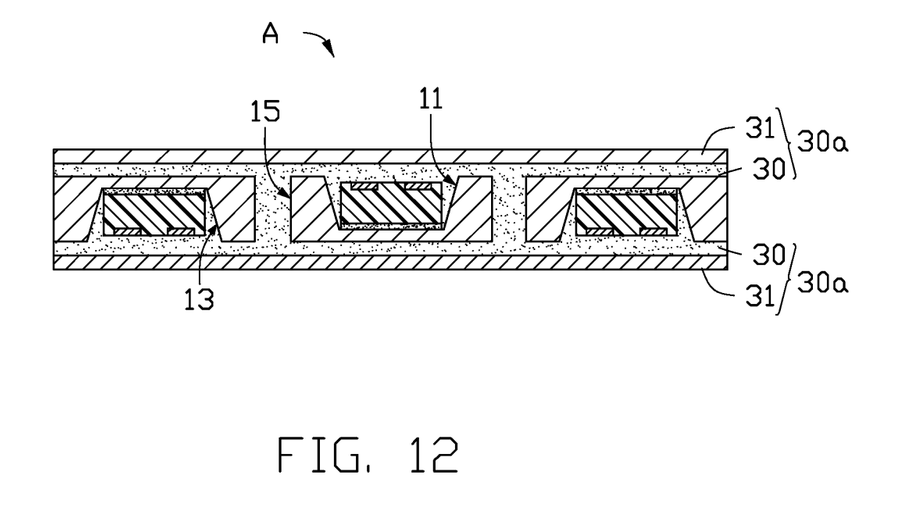

At block 601, referring to FIGS. 11 and 12, a first single-sided board 30a is laminated on each of the first surface 101 and the second surface 103 of the metal board 10 with the embedded components 20 respectively, thereby obtaining a first intermediate structure A. Each first single-sided board 30a includes an insulating layer 30 and a first metal layer 31 stacked on the insulating layer 30. A side of the insulating layer 30 facing away from the stacked insulating layer 30 is combined with the metal board 10. Two insulating layers 30 fill the first groove 11, the second groove 13, and the through hole 15.

Figure 13:
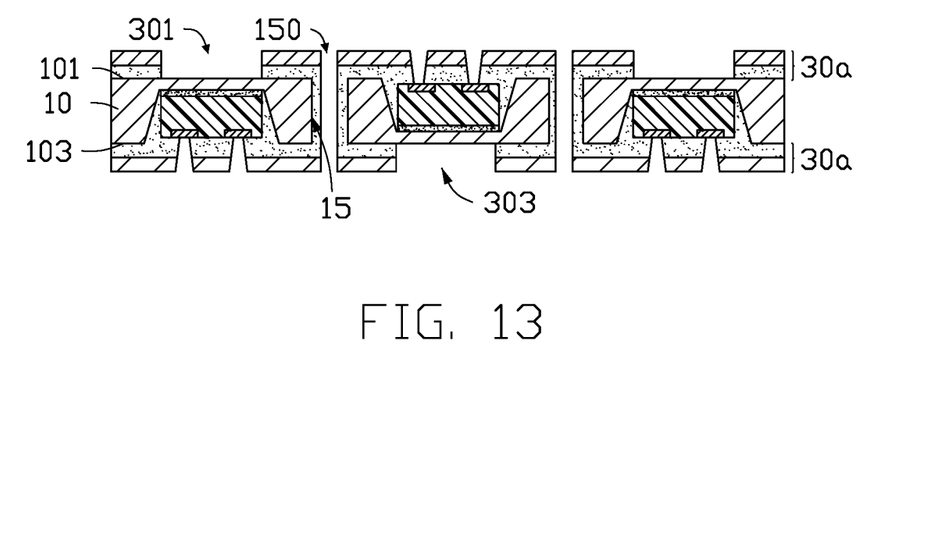

At block 602, referring to FIG. 13, a plurality of first slots 301 is defined on the first single-sided board 30a on a side of the first surface 101 facing away from the second surface 103 to expose each area of the first surface 101 of the metal board 10 corresponding to each second groove 13. A plurality of second slots 303 is defined on the first single-sided board 30a on a side of the second surface 103 facing away from the first surface 101 to expose each area of the second surface 103 of the metal board 10 corresponding to each first groove 11. A connecting hole 150 corresponding each through hole 15 is defined to penetrated two first single-sided board 30a and the corresponding through hole 15 of the metal board 10.

In at least one embodiment, each first slot 301 corresponds to one area of the first surface 101 of the metal board 10 corresponding to one second groove 13. Each second slot 303 corresponds to one area of the second surface 103 of the metal board 10 corresponding to one first groove 11.

In at least one embodiment, a width of the connecting hole 150 is less than a width of the corresponding through hole 15, and a sidewall surrounding to define the connecting hole 150 is spaced from a sidewall surrounding to define the corresponding through hole 15.

Figure 14:
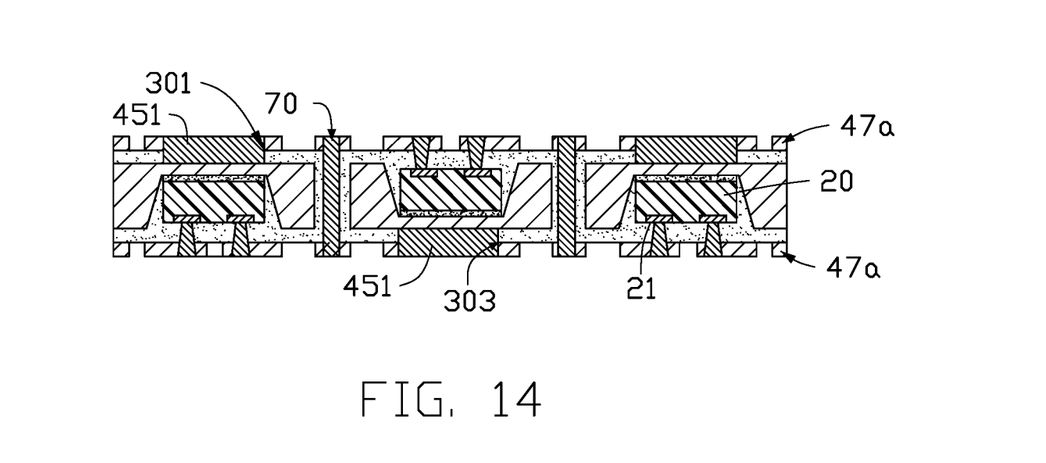

At block 603, referring to FIG. 14, a first conductive heat dissipating portion 451 is formed in each of the first slots 301 and the second slots 303, two first wiring layers 47a are formed on two opposite surfaces of the insulating layers 30 facing away from the metal board 10, and a conductive via 70 is formed corresponding to each connecting hole 150.

In at least one embodiment, each first wiring layer 47a is electrically connected to the at least one conductive terminal 21 of the adjacent embedded component 20.

Figure 15:
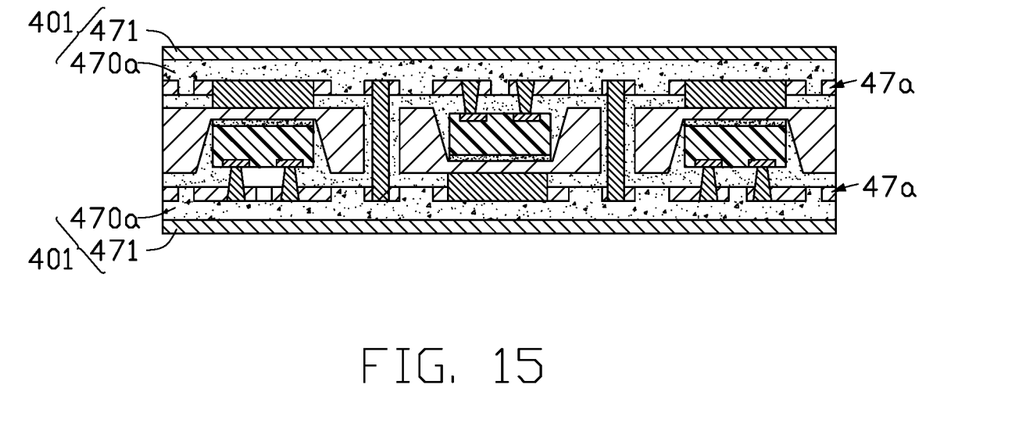

At block 604, referring to FIG. 15, a second single-sided board 401 is laminated on a side of each of the first wiring layers 47a facing away from the metal board 10. The second single-sided board 401 includes a first dielectric layer 470a and a second metal layer 471 stacked on the first dielectric layer 470a. The first dielectric layer 470a is combined with the adjacent first wiring layer 47a and fills gaps of the adjacent first wiring layer 47a.

Figure 16:
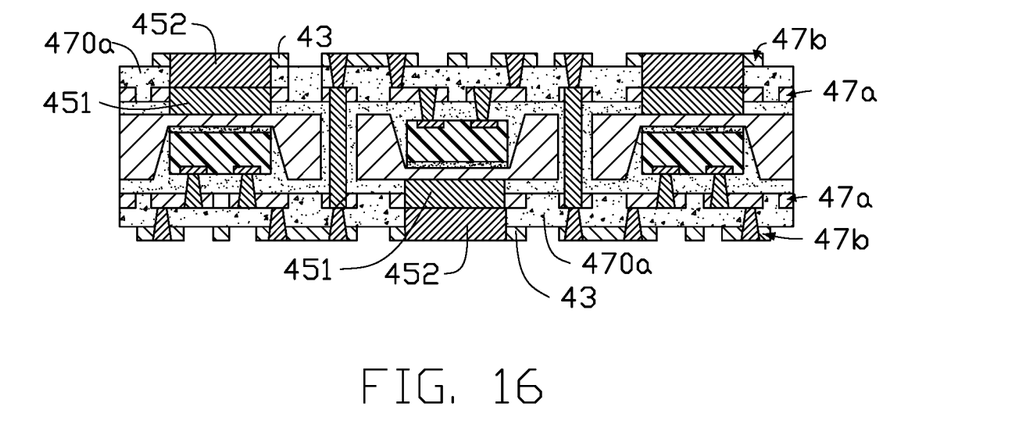

At block 605, referring to FIG. 16, a second conductive heat dissipating portion 452 corresponding to each first conductive heat dissipating portion 451 is formed and penetrates the second single-sided board 401. A second wiring layer 47b is formed on each first dielectric layer 470a. Each first dielectric layer 470a includes at least one ground wiring 43. The second conductive heat dissipating portion 452 penetrates the ground wiring 43 and the corresponding first dielectric layer 470a to electrically connect the ground wiring 43 and the first conductive heat dissipating portion 451 corresponding to the ground wiring 43.

The second wiring layer 47b is electrically connected to the first wiring layer 47a.

Figure 17:
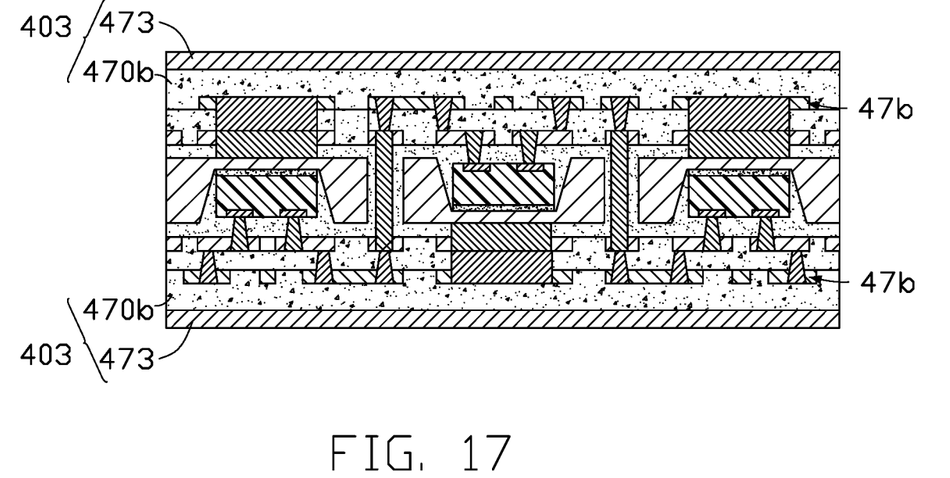

At block 606, referring to FIG. 17, a third single-sided board 403 is laminated on a side of each second wiring layer 47b facing away from the metal board 10. The third single-sided board 403 includes a second dielectric layer 470b and a third metal layer 473. The second dielectric layer 470b is combined with the adjacent second wiring layer 47b and fills gaps of the adjacent second wiring layer 47b.

At block 607, referring to FIG. 5, a third conductive heat dissipating portion 453 corresponding to each second conductive heat dissipating portion 452 is formed and penetrates the third single-sided board 403. At least one antenna 41 is formed on each second dielectric layer 470b. The third conductive heat dissipating portion 453 penetrates the adjacent second dielectric layer 470b to electrically connect the ground wiring 43 and the second conductive heat dissipating portion 452.

One third conductive heat dissipating portion 453, the corresponding second conductive heat dissipating portion 452, and the corresponding first conductive heat dissipating portion 451 are connected in that sequence to form a conductive heat sink 45. The first dielectric layer 471a and the second dielectric layer 470b constitute a dielectric layer 470.

Depending on the embodiment, certain of the steps of methods described may be removed, others may be added, and the sequence of steps may be altered. It is also to be understood that the description and the claims drawn to a method may include some indication in reference to sequential steps. However, the indication used is only to be viewed for identification purposes and not as a suggestion as to an order for the steps.

Figure 18:
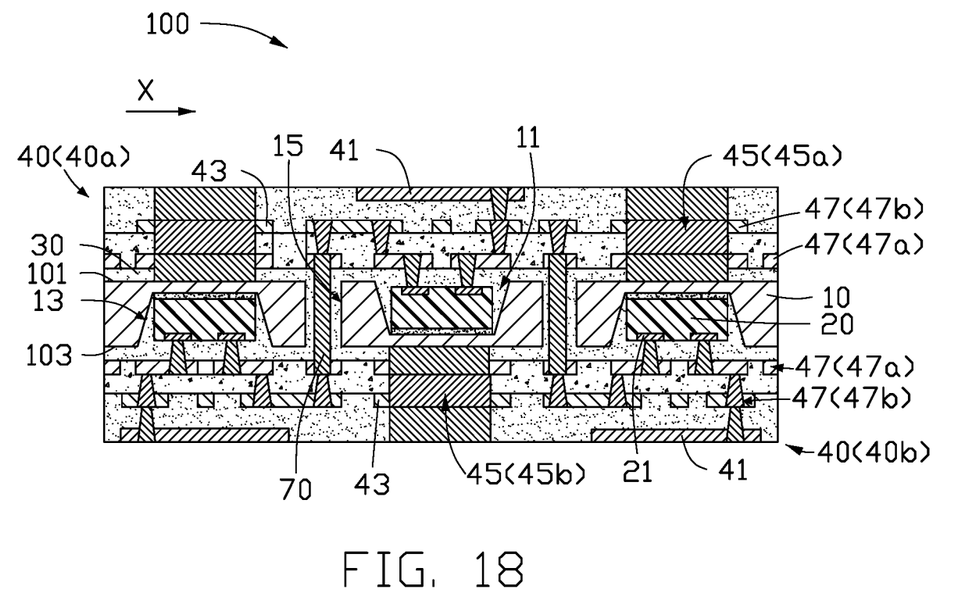
FIG. 18 is a diagrammatic view of an embodiment of a package circuit structure.

FIG. 18 illustrates an embodiment of a package circuit structure 100. The package circuit structure 100 includes a metal board 10, a plurality of embedded components 20, an insulating layer 30, and two antenna circuit boards 40. The metal board 10 includes a first surface 101 and a second surface 103 facing away from the first surface 101. The first surface 101 and the second surface 103 are arranged along a thickness direction of the metal board 10. At least one first groove 11 is recessed from the first surface 101 toward the second surface 103. At least one second groove 13 is recessed from the second surface 103 toward the first surface 101. The at least one first groove 11 and the at least one second groove 13 are spaced with each other along a first direction X perpendicular to the thickness direction. Each of the plurality of embedded components 20 is mounted in one of the at least one first groove 11 or one of the at least one second groove 13. The insulating layer 30 covers the first surface 101 and the second surface 103 and fills the at least one first groove 11 and the at least one second groove 13. The antenna circuit boards 40 are respectively stacked along the thickness direction on two opposite sides of the insulating layer 30. Each of the antenna circuit boards 40 includes at least one antenna 41 and at least one ground wiring 43. The metal board 10 is electrically connected to each of at least two ground wirings 43 of the antenna circuit boards 40.

In at least one embodiment, the package circuit structure 100 may include a plurality of first grooves 11 and a plurality of second grooves 13. The plurality of first grooves 11 and the plurality of the second grooves 13 are alternately arranged along the first direction X.

In at least one embodiment, each of the plurality of first grooves 11 and one of the plurality of the second grooves 13 may further be alternatively arranged along a second direction Y perpendicular to the first direction X and the thickness direction. So that the plurality of first grooves 11 and the plurality of the second grooves 13 are arranged in a matrix.

The antenna circuit board 40 includes a first antenna circuit board 40a and a second antenna circuit board 40b. The first antenna circuit board 40a is located on one of the opposite sides of the insulating layer 30 adjacent to the first surface 101. The second antenna circuit board 40b is located on another of the opposite sides of the insulating layer 30 adjacent to the second surface 103.

The package circuit structure 100 may further include at least one first conductive heat sink 45a and at least one second conductive heat sink 45b. Each of the at least one first conductive heat sink 45a penetrates the first antenna circuit board 40a along a thickness direction and penetrates a portion of the insulating layer 30 to connect an area of the adjacent first surface 101 of the metal board 10 corresponding to the second groove 13. Each of the at least one second conductive heat sink 45b penetrates the second antenna circuit board 40b along thickness direction, and penetrates a portion of the insulating layer 30 to connect an area of the adjacent second surface 103 of the metal board 10 corresponding to the first groove 11. So that the heat diffusion of the embedded components 20 may be accelerated, and it is beneficial to heat dissipation of the package circuit structure 100.

In at least one embodiment, on each of two opposite sides of the metal board 10 in the package circuit structure 100, an antenna area corresponding one antenna 41 and a heat dissipation area corresponding to one of the at least one first conductive heat sink 45a or one of the at least one second conductive heat sink 45b are alternately arranged along the first direction X. The antenna area corresponding one antenna 41 and the heat dissipation area corresponding to one of the at least one first conductive heat sink 45a or one of the at least one second conductive heat sink 45b may further be alternately arranged along the second direction Y. So that the antenna areas and the heat dissipation areas are arranged in a matrix on each of two opposite sides of the metal board 10.

In at least one embodiment, along a same direction, a width of each of the at least one first conductive heat sink 45a is less than a width of an opening portion of the second groove 13 corresponding the first conductive heat sink 45a along the thickness direction. A width of each of the at least one second conductive heat sink 45b is less than a width of an opening portion of the first groove 11 corresponding the second conductive heat sink 45b along the thickness direction.

Each of the at least one first conductive heat sink 45a is electrically connected to one of the at least one ground wiring 43 of the first antenna circuit board 40a. Each of the at least one second conductive heat sink 45b is electrically connected to one of the at least one ground wiring 43 of the second antenna circuit board 40b.

In at least one embodiment, each of the first antenna circuit board 40a and the second antenna circuit board 40b may further include at least one wiring layer 47. The at least one wiring layer 47 of the first antenna circuit board 40a is between the at least one antenna 41 of the first antenna circuit board 40a and the insulating layer 30. The least one wiring layer 47 of the second antenna circuit board 40b between the at least one antenna 41 of the second antenna circuit board 40b and the insulating layer 30.

In at least one embodiment, each of the first antenna circuit board 40a and the second antenna circuit board 40b may include a first wiring layer 47a and a second wiring layer 47b stacked on the first wiring layer 47a along the thickness direction.

In at least one embodiment, referring to FIG. 8, at least one of the antenna circuit boards 40 may further include at least one connecting pad 48 exposed from a side of the corresponding antenna circuit board 40 facing away from the metal board 10 for connecting other electronic elements. Each connecting pad 48 electrically connects the at least one wiring layer 47.

In at least one embodiment, the package circuit structure 100 may further include solder masks formed on two opposite surfaces of the antenna circuit boards 40 facing away from the metal board 10. The at least one connecting pad 48 is exposed from the solder masks for connecting other electronic elements.

At least one conductive terminal 21 is formed on each of the plurality of the embedded components 20. Each of the plurality of the embedded components 20 is electrically connected to one of the antenna circuit boards 40 through the at least one conductive terminal 21. In at least one embodiment, the at least one conductive terminal 21 may be formed on a side of each of the plurality of the embedded components 20 received in the first groove 11 or the second groove 13 facing away from a bottom of the corresponding first groove 11 or a bottom of the corresponding second groove 13. So that a signal transmission loss between the antenna 41 and the embedded component 20 electrically connected to the corresponding antenna 41 may be reduced.

The metal board 10 may further include at least one through hole 15 penetrating the first surface 101 and the second surface 103. The at least one through hole 15 is spaced from the at least one first groove 11 and the at least one second groove 13.

A conductive via 70 corresponding each of the at least one through hole 15 may be formed and penetrates the corresponding through hole 15 to electrically connect the antenna circuit boards 40. The conductive via 70 is spaced from an inner wall surrounding to define the corresponding through hole 15 by the insulating layer 30.

In the package circuit structure 100, the at least one groove 11 and the at least one groove 13 are recessed in opposite direction and spaced from each other along the first direction X perpendicular to the thickness direction, which may improve the heat dissipation efficiency and a temperature equalization effect of the package circuit structure 100. The metal board 10 is electrically connected to the ground wiring, which may avoid electromagnetic interference between the embedded components 20. Furthermore, the conductive heat sink 45 (45a, 45b) may improve the heat dissipation efficiency of the package circuit structure 100. In addition, the antenna 41 and the conductive heat sink 45 (45a, 45b) are alternately arranged, which may further improve the heat dissipation efficiency and a temperature equalization effect of the package circuit structure 100.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a package circuit structure comprising:
    providing a metal board along a thickness direction comprising a first surface and a second surface facing away from the first surface;
    recessing at least one first groove from the first surface toward the second surface, recessing at least one second groove from the second surface toward the first surface, wherein each of the at least one first groove and each of the at least one second groove are spaced with each other along a first direction perpendicular to the thickness direction;
    mounting an embedded component in each of the at least one first groove and each of the at least one second groove respectively;
    laminating a dielectric layer and an antenna circuit board sequentially on each of the first surface and the second surface of the metal board with the embedded components respectively, wherein two dielectric layers cover the first surface and the second surface, and fill the at least one first groove and the at least one second groove, two antenna circuit boards are stacked on opposite sides of the two dielectric layers along the thickness direction facing away from each other, each of the two antenna circuit boards comprises at least one antenna and at least one ground wiring, the metal board is electrically connected to the at least one ground wiring.

2. The method of claim 1, wherein a plurality of first grooves and a plurality of second grooves are formed, the plurality of first grooves and the plurality of second grooves are alternatively arranged along the first direction.

3. The method of claim 2, wherein the plurality of first grooves and the plurality of second grooves are alternatively arranged along a second direction perpendicular to the first direction and the thickness direction, the plurality of first grooves and the plurality of second grooves are arranged in a matrix.

4. The method of claim 3, wherein before mounting the embedded component in each of the at least one first groove and each of the at least one second groove respectively, further comprising defining at least one through hole penetrating the metal board along the thickness direction;
wherein in the step of laminating a dielectric layer and an antenna circuit board sequentially on each of the first surface and the second surface of the metal board with the embedded components respectively, the dielectric layers fills the at least one through hole; and the two antenna circuit boards are electrically connected to each other through a conductive via corresponding each of the at least one through hole and penetrating the corresponding through hole, the conductive via is spaced from an inner wall surrounding to define the corresponding through hole by the dielectric layer.

5. The method of claim 4, wherein the step of laminating a dielectric layer and an antenna circuit board sequentially on each of the first surface and the second surface of the metal board with the embedded components respectively further comprises:
laminating a first single-sided board on each of the first surface and the second surface of the metal board with the embedded components respectively, wherein each first single-sided board comprises an insulating layer and a first metal layer stacked on the insulating layer, two insulating layers are combined with the metal board and fills in the plurality of first grooves, the plurality of second grooves and the plurality of through holes;
defining a plurality of first slots on the first single-sided board on a side of the first surface facing away from the second surface to expose each area of the first surface of the metal board corresponding to each of the plurality of second grooves, defining a plurality of second slots on the first single-sided board on a side of the second surface facing away from the first surface to expose each area of the second surface of the metal board corresponding to each first groove, and defining a connecting hole corresponding each of the at least one through hole to penetrated two first single-sided board and the corresponding through hole;
forming a first conductive heat dissipating portion in each of the plurality of first slots and the plurality of second slots respectively, and forming a first wiring layer on a surface of each of the insulating layers facing away from the metal board, and forming a conductive via corresponding to each connecting hole;
laminating a second single-sided board on a side of each of two first wiring layers facing away from the metal board respectively, wherein the second single-sided board comprises a first dielectric layer and a second metal layer stacked on the first dielectric layer, a side of the first dielectric layer facing away from the second metal layer is combined with the first wiring layer and fills gaps of the first wiring layer;
forming a second conductive heat dissipating portion corresponding to each of a plurality of first conductive heat dissipating portions to penetrate one of two second single-sided boards, and forming a second wiring layer on a surface of each of two first dielectric layers facing away from the metal board respectively, wherein the second wiring layer comprises a plurality of ground wirings, each of a plurality of second conductive heat dissipating portions penetrates one of the plurality of ground wirings and one of the two first dielectric layers to electrically connect the one of the plurality of ground wirings and one of the plurality of first conductive heat dissipating portions;
laminating a third single-sided board on a side of each of two second wiring layers facing away from the metal board respectively, wherein the third single-sided board comprises a second dielectric layer and a third metal layer, a side of the second dielectric layer facing away from the third metal layer is combined with the second wiring layer and fills gaps of the second wiring layer; and
forming a third conductive heat dissipating portion corresponding to each of a plurality of second conductive heat dissipating portions to penetrate one of two third single-sided boards, and forming a plurality of antennas on each of two second wiring layers, wherein each of a plurality of third conductive heat dissipating portions, one corresponding of the plurality of second conductive heat dissipating portions, and one corresponding of the plurality of first conductive heat dissipating portions are connected in that sequence to form a conductive heat sink.

6. The method of claim 5, wherein at least one conductive terminal is formed on a side of each of a plurality of embedded components facing away from a bottom of the plurality of first grooves or a bottom of the plurality of second grooves, each of the plurality of embedded components is electrically connected to one of the antenna circuit boards through the at least one conductive terminal.

7. The method of claim 3, wherein the two antenna circuit boards comprise a first antenna circuit board on a side of the first surface facing away from the second surface and a second antenna circuit board on a side of the second surface facing away from the first surface; the first antenna circuit board comprises at least one first conductive heat sink, each of the at least one first conductive heat sink penetrates the first antenna circuit board and the adjacent dielectric layer along the thickness direction to connect an area of the first surface of the metal board corresponding to the second groove; the second antenna circuit board comprises at least one second conductive heat sink, each of the at least one second conductive heat sink penetrates the second antenna circuit board and the adjacent dielectric layer along the thickness direction to connect an area of the second surface of the metal board corresponding to the first groove.

8. The method of claim 7, wherein the package circuit structure comprises a plurality of the first conductive heat sinks and a plurality of the second conductive heat sinks, the plurality of the first conductive heat sinks and the antennas of the first antenna circuit board are arranged in a matrix, the plurality of the second conductive heat sinks and the antennas of the second antenna circuit board are arranged in a matrix.

9. The method of claim 1, wherein each of the two antenna circuit boards further comprises at least one wiring layer, the at least one wiring layer of each of the two antenna circuit boards is between the at least one antenna of the corresponding antenna circuit board and the adjacent dielectric layer.

10. A package circuit structure comprising:
a metal board;
a plurality of embedded components;
an insulating layer; and
two antenna circuit boards;
wherein the metal board includes a first surface and a second surface facing away from the first surface; the first surface and the second surface are arranged along a thickness direction of the metal board, at least one first groove is recessed from the first surface toward the second surface, at least one second groove is recessed from the second surface toward the first surface, the at least one first groove and the at least one second groove are spaced with each other along a first direction perpendicular to the thickness direction, each of the plurality of embedded components is mounted in one of the at least one first groove or one of the at least one second groove; the insulating layer covers the first surface and the second surface and fills the at least one first groove and the at least one second groove; the antenna circuit boards are respectively stacked along the thickness direction on two opposite sides of the insulating layer, each of the antenna circuit boards includes at least one antenna and at least one ground wiring, the metal board is electrically connected to the at least one ground wiring of each of the antenna circuit boards.

11. The package circuit structure of claim 10, wherein the package circuit structure further comprises a plurality of first grooves and a plurality of second grooves, the plurality of first grooves and the plurality of the second grooves are alternatively arranged along the first direction.

12. The package circuit structure of claim 11, wherein the plurality of first grooves and the plurality of second grooves are alternatively arranged along a second direction perpendicular to the first direction and the thickness direction, the plurality of first grooves and the plurality of second grooves are arranged in a matrix.

13. The package circuit structure of claim 12, wherein the antenna circuit boards includes a first antenna circuit board and a second antenna circuit board, the first antenna circuit board on one of the opposite sides of the insulating layer adjacent the first surface, the second antenna circuit board on another of the opposite sides of the insulating layer adjacent the second surface.

14. The package circuit structure of claim 13, wherein the package circuit structure further comprises a plurality of first conductive heat sinks and a plurality of second conductive heat sinks, each of the plurality of first conductive heat sinks penetrates the first antenna circuit board and a portion of the insulating layer along thickness direction to connect an area of the adjacent first surface of the metal board corresponding to the plurality of second grooves; each of the plurality of second conductive heat sinks penetrates the second antenna circuit board and a portion of the insulating layer to connect an area of the adjacent first surface of the metal board corresponding to the plurality of first grooves.

15. The package circuit structure of claim 14, wherein the first antenna circuit board comprises a plurality of antennas, the second antenna circuit board comprises a plurality of antennas of the first antenna circuit board, the plurality of first conductive heat sinks and the plurality of antennas are alternatively arranged along the first direction and the second direction respectively; the plurality of second conductive heat sinks and the plurality of antennas of the second antenna circuit board are alternatively arranged along the first direction and the second direction respectively.

16. The package circuit structure of claim 15, wherein the first antenna circuit board further comprises a plurality of ground wirings, the second antenna circuit board further comprises a plurality of ground wirings, each of the plurality of first conductive heat sinks is electrically connected to one of the plurality of ground wirings of the first antenna circuit board, each of the plurality of second conductive heat sinks is electrically connected to one of the plurality of ground wirings of the second antenna circuit board.

17. The package circuit structure of claim 13, wherein the first antenna circuit board comprises at least one wiring layer between the at least one antenna of the first antenna circuit board and the insulating layer, the second antenna circuit board comprises at least one wiring layer between the at least one antenna od the second antenna circuit board and the insulating layer.

18. The package circuit structure of claim 10, wherein at least one conductive terminal is formed on a side of each of the plurality of embedded components facing away from a bottom of the plurality of first grooves or a bottom of the plurality of second grooves, each of the plurality of embedded components is electrically connected to one of the antenna circuit boards through the at least one conductive terminal.

* * * * *